(12) United States Patent
Chen et al.

(10) Patent No.: US 11,101,781 B2
(45) Date of Patent: Aug. 24, 2021

(54) AMPLIFIER DEVICE AND OFFSET CANCELLATION METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yen-Chung Chen, Hsinchu (TW); Tsai-Ming Yang, Hsinchu (TW); Ting-Hsu Chien, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 112 days.

(21) Appl. No.: 16/575,408

(22) Filed: Sep. 19, 2019

(65) Prior Publication Data

US 2021/0091736 A1 Mar. 25, 2021

(51) Int. Cl.
*H03F 3/45* (2006.01)
*H03K 19/00* (2006.01)

(52) U.S. Cl.
CPC ..... *H03F 3/45973* (2013.01); *H03F 3/45475* (2013.01); *H03F 3/45744* (2013.01); *H03K 19/0027* (2013.01)

(58) Field of Classification Search
CPC ............ H03F 3/45973; H03F 3/45744; H03F 3/45475; H03K 19/0027
USPC ............................................... 330/9, 252–261
See application file for complete search history.

(56) References Cited

U.S. PATENT DOCUMENTS

| 9,136,904 B2* | 9/2015 | Ali | H04B 3/04 |
| 9,614,564 B2* | 4/2017 | Chang | H04L 27/01 |
| 2014/0036982 A1 | 2/2014 | Ali et el. | |

* cited by examiner

*Primary Examiner* — Hieu P Nguyen
(74) *Attorney, Agent, or Firm* — CKC & Partners Co., LLC

(57) ABSTRACT

An amplifier device includes an amplifier circuitry, a controller circuitry, and an offset cancellation circuitry. The amplifier circuitry is configured to amplify a first input signal and a second input signal, in order to generate a first output signal and a second output signal. The controller circuitry is configured to generate a first control signal and a second control signal according to the first output signal and the second output signal. The offset cancellation circuitry is configured to provide a negative capacitor to the amplifier circuitry, and to adjust at least one current flowing through a circuit, which provides the negative capacitor, of the offset cancellation circuitry according to the first control signal and the second control signal, in order to cancel an offset of the amplifier circuitry.

10 Claims, 4 Drawing Sheets

AMPLIFIER DEVICE AND OFFSET CANCELLATION METHOD

BACKGROUND

Technical Field

The present disclosure relates to an amplifier device. More particularly, the present disclosure relates to an amplifier device having an offset cancellation circuitry and an offset cancellation method.

Description of Related Art

Amplifiers have been widely utilized in various electronic devices. In practical applications, due to impacts from various variations or circuit shifts, an offset may be present in the amplifier, resulting in the inaccuracy or the failure of the amplifier. In some approaches, an additional error cancelation circuit may be employed to calibrate the offset of the amplifier. However, in these approaches, additional capacitive loads may be introduced from the error cancelation circuit to the amplifier, resulting in a significant decrement in bandwidth of the amplifier.

SUMMARY

Some aspects of the present disclosure are to provide an amplifier device that includes an amplifier circuitry, a controller circuitry, and an offset cancellation circuitry. The amplifier circuitry is configured to amplify a first input signal and a second input signal, in order to generate a first output signal and a second output signal. The controller circuitry is configured to generate a first control signal and a second control signal according to the first output signal and the second output signal. The offset cancellation circuitry is configured to provide a negative capacitor to the amplifier circuitry, and to adjust at least one current flowing through a circuit, which provides the negative capacitor, of the offset cancellation circuitry according to the first control signal and the second control signal, in order to cancel an offset of the amplifier circuitry.

Some aspects of the present disclosure are to provide to an offset cancellation method that includes the following operations: providing, by an impedance transformation circuit, an negative capacitor to an amplifier circuitry; and adjusting at least one current flowing through the impedance transformation circuit in response to a first output signal and a second output signal of the amplifier circuitry, in order to cancel an offset of the amplifier circuitry.

As described above, the amplifier device and the offset cancellation method provided in some embodiments of the present disclosure are able to improve the bandwidth of the amplifier device with the negative capacitor, and to cancel the offsets of the amplifier device by adjusting the current flowing through a circuit that generates the negative capacitor.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
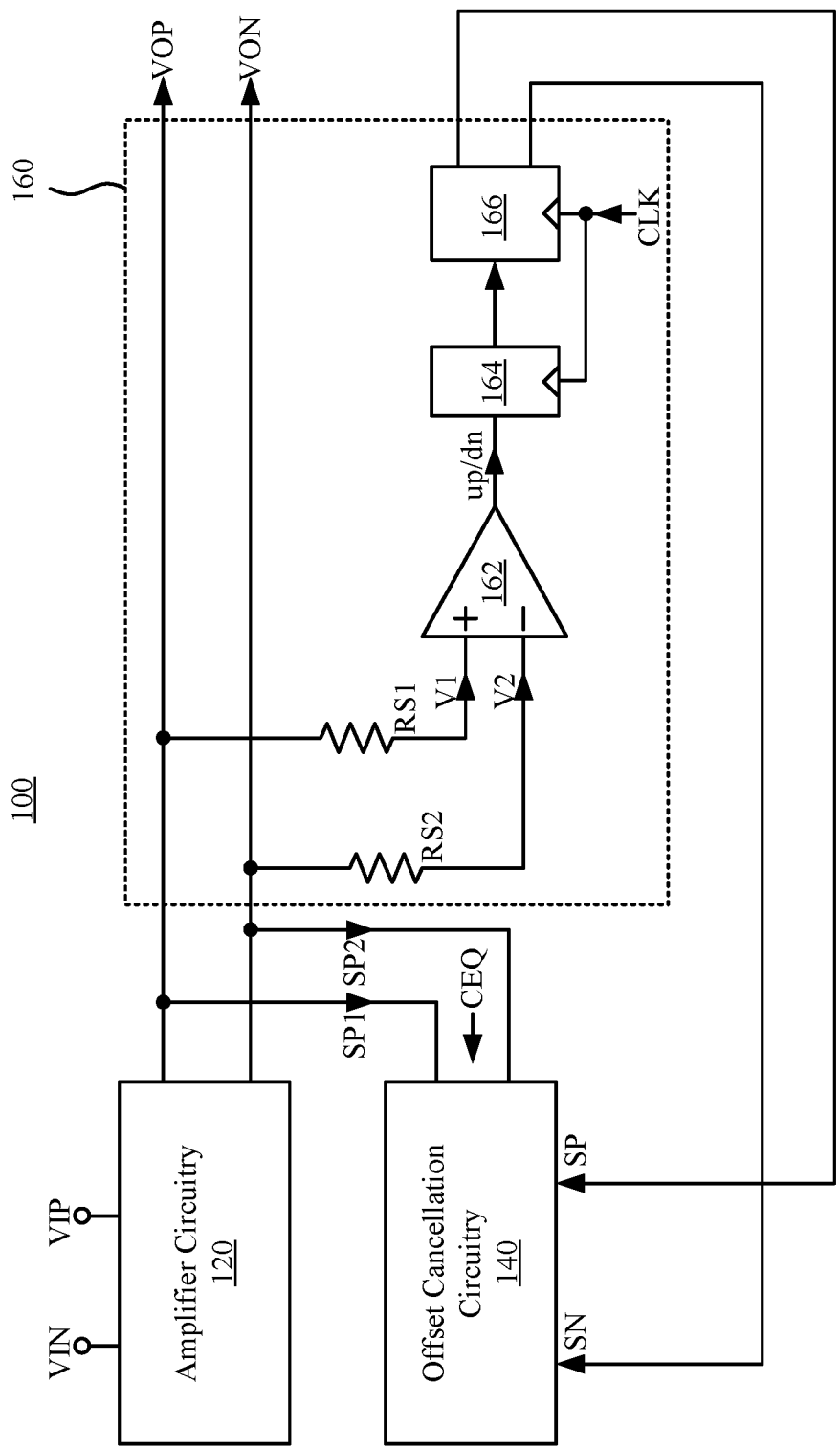
FIG. 1 is a schematic diagram of an amplifier device according to some embodiments of the present disclosure.

Reference is made to FIG. 1. FIG. 1 is a schematic diagram of an amplifier device 100 according to some embodiments of the present disclosure.

The amplifier device 100 includes an amplifier circuitry 120, an offset cancellation circuitry 140, and a controller circuitry 160. The amplifier circuitry 120 is configured to amplify an input signal VIP and an input signal VIN, in order to generate an output signal VOP and an output signal VON. In some embodiments, the input signal VIP and the input signal VIN are differential signals, and the output signal VOP and the output signal VON are differential signals as well.

The offset cancellation circuitry 140 is coupled to the amplifier circuitry 120 and the controller circuitry 160. In some embodiments, the offset cancellation circuitry 140 is able to equivalently provide an negative capacitor CEQ, in order to reduce additional capacitive loads introduced from the offset cancellation circuitry 140 to the amplifier circuitry 120, and/or to reduce parasitic capacitors of the amplifier circuitry 120 (e.g., capacitors C1-C2 in FIG. 2). As a result, bandwidth of the amplifier circuitry 120 can be further increased.

Furthermore, the offset cancellation circuitry 140 may adjust at least one current flowing through a circuit for providing the negative capacitor CEQ (e.g., impedance transformation circuit 142 in FIG. 2) according to a control signal SP and a control signal SN transmitted from the controller circuitry 160, in order to generate a compensation signal SP1 and a compensation signal SP2 for cancelling offset(s) of the amplifier circuitry 120. In practical applications, the offset(s) of the amplifier circuitry 120 may be introduced from non-ideal factors (which may include process variations or mismatches of internal circuits), resulting in inaccurate output signals VOP and VON. It is noted that, according to different offsets, the compensation signal SP1 and/or the compensation signal SP2 may be inputted into the amplifier circuitry 120, or may be drained from the amplifier circuitry 120 (as shown in FIG. 1). For ease of understanding, in each figure, the transmission direction of the compensation signals SP1 and SP2 is illustrated with a single direction, but the present disclosure is not limited thereto.

The controller circuitry 160 is coupled to the amplifier circuitry 120 to receive the output signal VOP and the output signal VON, and is coupled to the offset cancellation circuitry 140 to transmit the control signal SP and the control signal SN. In some embodiments, the controller circuitry 160 may sense the offset(s) of the amplifier circuitry 120 according to the output signal VOP and the output signal VON, in order to generate the control signal SP and the control signal SN.

For example, the controller circuitry 160 may include a resistor RS1, a resistor RS2, a comparator circuit 162, a flip flop circuit 164, and a counter circuit 166. The resistor RS1 and the resistor RS2 are respectively coupled to output terminals of the amplifier circuitry 120, in order to respectively receive the output signal VOP and the output signal VON. The resistor RS1 provides a voltage V1 based on the output signal VOP, and the resistor RS2 provides a voltage V2 based on the output signal VON. Input terminals of the comparator circuit 162 are coupled to the resistor RS1 and the resistor RS2, in order to receive the voltage V1 and the voltage V2. The comparator circuit 162 is configured to compare the voltage V1 with the voltage V2, in order to generate a count signal up/dn and to transmit the same to the flip flop circuit 164. The flip flop circuit 164 outputs the count signal up/dn to the counter circuit 166 based on the clock signal CLK. The counter circuit 166 receives the count signal up/dn according to the clock signal CLK, and performs a up/down counting operation according to the count signal up/dn and the clock signal CLK, in order to generate a corresponding control signal SP and a corresponding control signal SN. In some embodiments, the counter circuit 166 may include one or more encoder circuits (not shown), and the one or more encoder circuits may generate the control signal SP and the control signal SN when the counter circuit 166 generates a count value.

For example, when operating in the calibration mode, the input signal VIN and the input signal VIP are set as the same common mode voltage. Under this condition, ideally, a DC voltage level of the output signal VOP and that of the output signal VON (i.e., the voltages V1 and V2) should be the same. If an offset is present in the amplifier circuitry 120, a difference is present between the voltage V1 and the voltage V2. In response to this difference, the comparator circuit 162 outputs a corresponding count signal up/dn.

For example, if the voltage V1 is higher than the voltage V2, the comparator circuit 162 outputs the count signal up/dn having a logic value of 1, and the counter circuit 166 thus performs an up-counting operation to update the control signals SP and SN. Alternatively, if the voltage V2 is higher than the voltage V1, the comparator circuit 162 outputs the count signal up/dn having a logic value of 0, and the counter circuit 166 thus performs a down-counting operation to update the control signals SP and SN. According to different control signals SP and SN, the offset cancellation circuitry 140 provides (or drains) the corresponding compensation signals SP1 and SP2, in order to cancel the offset of the amplifier circuitry 120. The above operations are feedback control. With the above operations, the DC voltage level of the output signal VOP and that of the output signal VON (i.e., voltages V1 and V2) can be calibrated to be the same.

In some embodiments, the flip flop circuit 164 may be a D Flip-flop. In some embodiments, the counter circuit 166 may be an up/down counter. The implementations of the controller circuitry 160 are given for illustrative purposes, and the present disclosure is not limited thereto. In other embodiments, the controller circuitry 160 may be implemented with an analog-to-digital converter, a digital-to-analog converter, and/or a mixed circuit that performs a specific algorithm (which may be, but not limited to, a successive approximation algorithm).

The following paragraphs provide several embodiments to illustrate examples of circuits in the amplifier device 100, but the present disclosure is not limited thereto.

Figure 2:
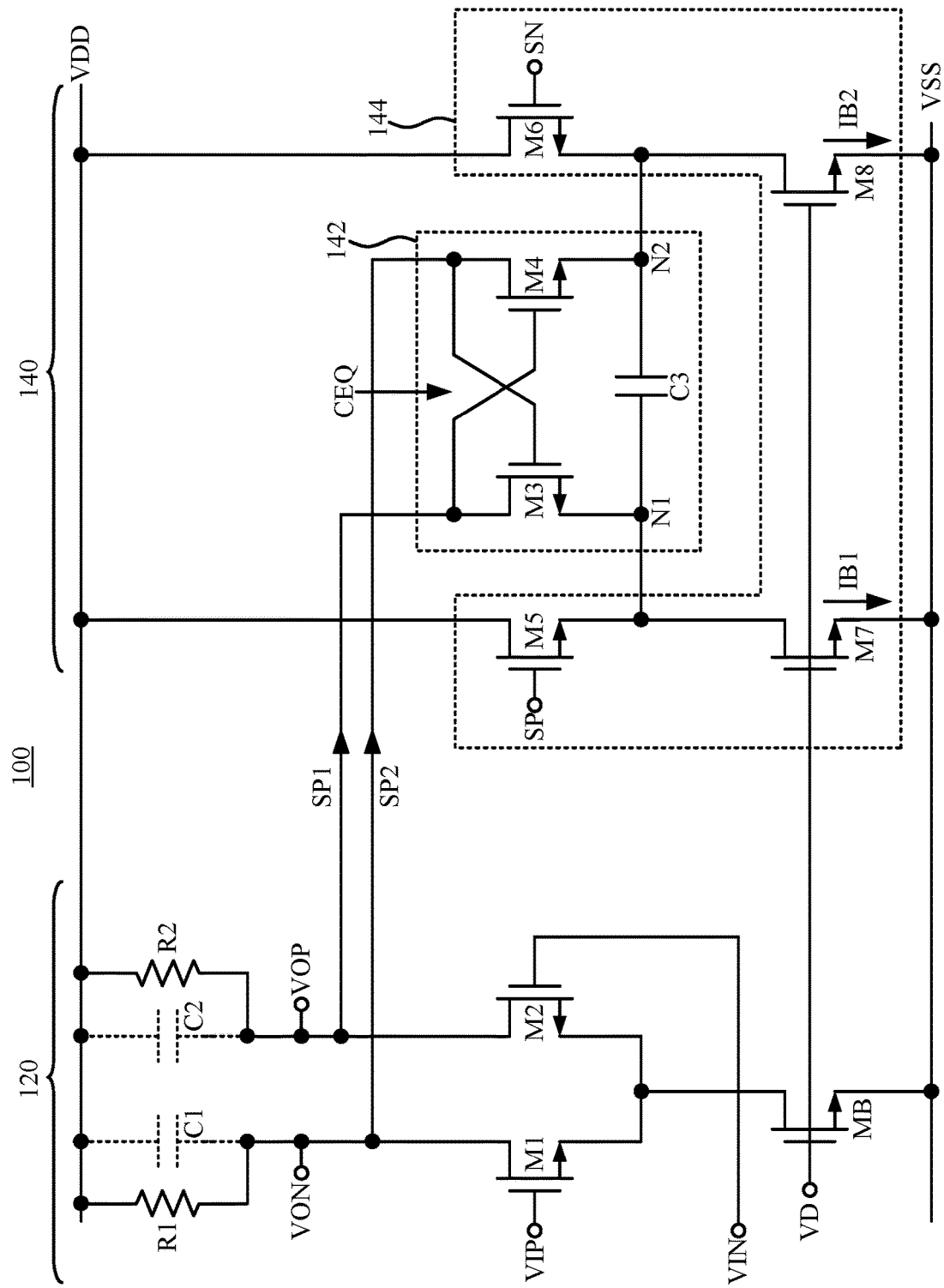
FIG. 2 is a schematic diagram of the amplifier circuitry and the offset cancellation circuitry in FIG. 1, according to some embodiments of the present disclosure.

Reference is made to FIG. 2. FIG. 2 is a schematic diagram of the amplifier circuitry 120 and the offset cancellation circuitry 140 in FIG. 1, according to some embodiments of the present disclosure. For ease of understanding, like elements in FIGS. 1-2 are designated with the same reference number.

In some embodiments, the amplifier circuitry 120 includes transistors M1-M2 and MB and resistors R1-R2. The transistors M1-M2 operate as an input pair circuit. The transistor MB operates as a current source to bias the transistors M1-M2.

In greater detail, a control terminal of the transistor M1 is configured to receive the input signal VIP, and a first terminal of the transistor M1 is coupled to one terminal of the resistor R1 to generate the output signal VON. A control terminal of the transistor M2 is configured to receive the input signal VIN, and a first terminal of the transistor M2 is coupled to one terminal of the resistor R2 to generate the output signal VOP. Second terminals of transistors M1-M2 are coupled to a first terminal of the transistor MB. Another terminal of the resistor R1 and another terminal of the resistor R2 are coupled to a voltage source, in order to receive a voltage VDD. A control terminal of the transistor MB is configured to receive a bias signal VD, and a second terminal of the transistor MB is coupled to a voltage source, in order to receive a voltage VSS (which may be, but not limited to, a ground voltage). In this example, the voltage VDD may be set to be higher than the voltage VSS.

The offset cancellation circuitry 140 includes an impedance transformation circuit 142 and a calibration circuit 144. The impedance transformation circuit 142 is coupled to the first terminals of the transistors M1-M2 (which may be considered as output terminals of the amplifier circuitry 120 in FIG. 1). The impedance transformation circuit 142 is configured to provide the negative capacitor CEQ to the amplifier circuitry 120, in order to increase the overall bandwidth of the amplifier device 100.

For example, the impedance transformation circuit 142 includes a transistor M3, a transistor M4, and a capacitor C3. A first terminal of the transistor M3 is coupled to the first terminal of the transistor M2 and a control terminal of the transistor M4, and a second terminal of the transistor M3 is coupled to a first terminal of the capacitor C3 (i.e., node N1). A first terminal of the transistor M4 is coupled to the first terminal of the transistor M1 and a control terminal of the transistor M3, and a second terminal of the transistor M4 is coupled to a second terminal of the capacitor C3 (i.e., node N2). With this arrangement, the impedance transformation circuit 142 is able to transform the capacitor C3 into the negative capacitor CEQ. The above transformation may be derived as the following equation:

$$CEQ = \frac{-(Cgs/C3 + 2)}{gm}$$

Cgs is a parasitic capacitance (not shown) between the control terminal and the second terminal of the transistor M3 (or the transistor M4), and gm is a transconductance of the transistor M3 (or the transistor M4). The negative capacitor CEQ is able to cancel parasitic capacitors (e.g., capacitors C1 and C2) of the amplifier circuitry 120, and to cancel other parasitic capacitors (not shown) that are introduced from the offset cancellation circuitry 140 to the amplifier circuitry 120. As a result, the capacitive load of the output terminals of the amplifier circuitry 120 is compensated, in order to increase applicable bandwidth of the amplifier circuitry 120.

The calibration circuit 144 is coupled to the impedance transformation circuit 142, and is configured to adjust a current flowing through the impedance transformation circuit 142 according to the control signal SP and the control signal SN, in order to cancel the offset of the amplifier circuitry 120.

For example, the calibration circuit 144 includes transistors M5-M8. First terminals of the transistors M5-M6 are coupled to the voltage source to receive the voltage VDD. A second terminal of the transistor M5 is coupled to the node N1 and a first terminal of the transistor M7. A control terminal of the transistor M5 is coupled to the controller circuitry 160 in FIG. 1, in order to receive the control signal SP. The transistor M5 is configured to be turned on according to the control signal SP, in order to provide a corresponding turn-on resistance. A second terminal of the transistor M7 is configured to receive the voltage VSS, and a control terminal of the transistor M7 is configured to receive the bias signal VD. The transistor M7 operates as a current source, in order to generate a bias current IB1 according to the bias signal VD, in order to bias the transistor M3 and the transistor M5.

With the above configuration, the transistor M3 and the transistor M5 share the bias current IB1 generated from the transistor M7. In response to the control signal SP, the transistor M5 provides a corresponding turn-on resistance. If the turn-on resistance is higher, a portion of the bias current IB1 that is steered to the transistor M5 is smaller, and a portion of the bias current IB1 (which may be considered as the compensation signal SP1 in FIG. 1) that is steered to the transistor M3 is larger. Alternatively, if the turn-on resistance is lower, the portion of the bias current IB1 that is steered to the transistor M5 is larger, and the portion of the bias current IB1 that is steered to the transistor M3 is smaller. Accordingly, the compensation signal SP1 is able to cancel the offset of the output terminal of the amplifier circuitry 120 (e.g., output terminal that generates the output signal VOP).

Similarly, a second terminal of the transistor M6 is coupled to the node N2 and a first terminal of the transistor M8. A control terminal of the transistor M6 is coupled to the controller circuitry 160 in FIG. 1, in order to receive the control signal SN. The transistor M6 is configured to be turned on according to the control signal SN, in order to provide a corresponding turn-on resistance. A second terminal of the transistor M8 is configured to receive the voltage VSS, and a control terminal of the transistor M8 is configured to receive the bias signal VD. The transistor M8 operates as a current source, in order to generate a bias current IB2 according to the bias signal VD, in order to bias the transistor M4 and the transistor M6. Similar to the above operations, the transistor M6 is able to provide the corresponding turn-on resistance according to the control signal SN, in order to provide different turn-on resistances to determine a portion of the bias current IB2 that is steered to the transistor M6 (which may be considered as the compensation signal SP2 in FIG. 1). Accordingly, the compensation signal SP2 is able to cancel the offset on the output terminal of the amplifier circuitry 120 (e.g., output terminal that generates the output signal VON).

Figure 3:
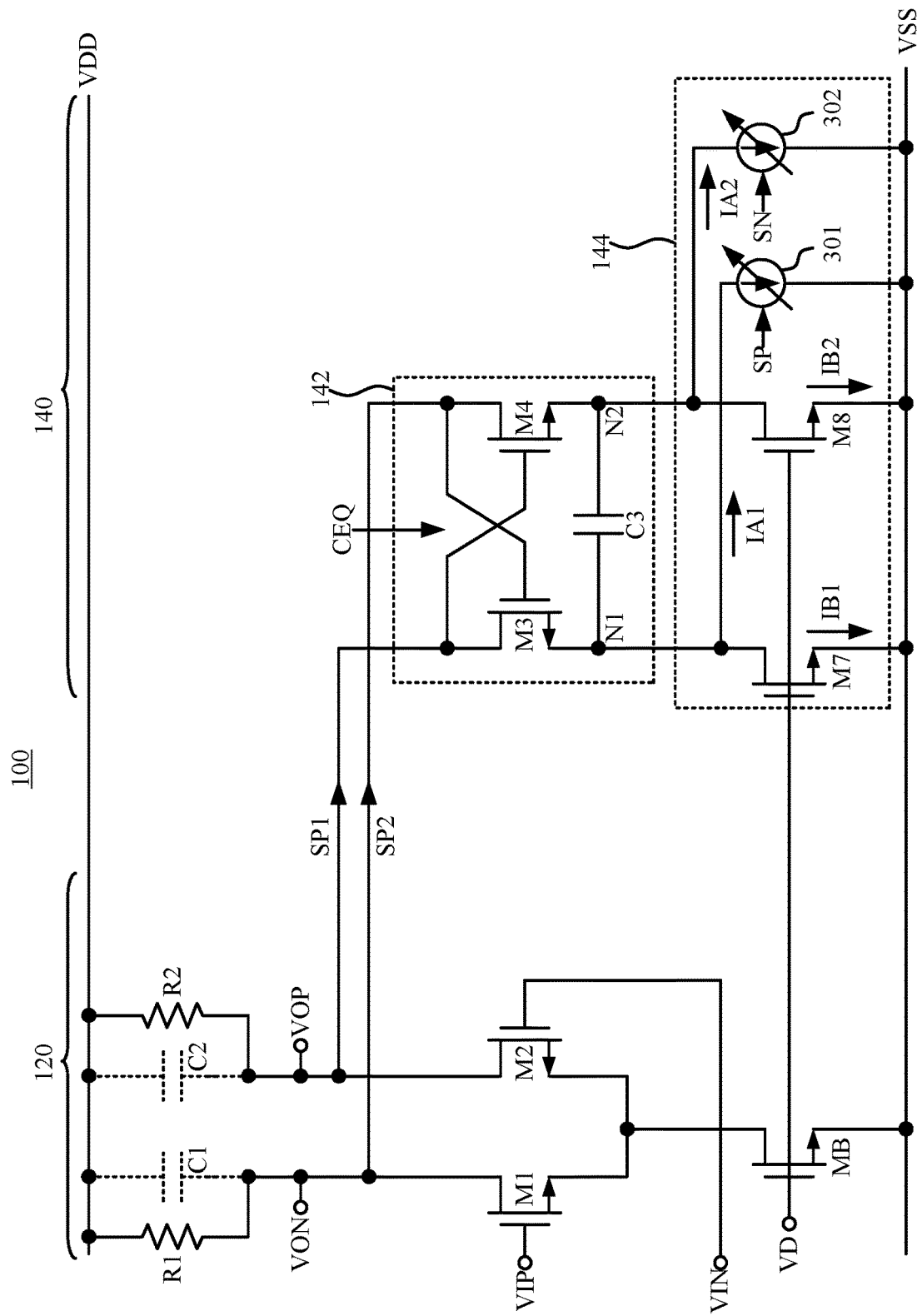
FIG. 3 is a schematic diagram of the amplifier circuitry and the offset cancellation circuitry in FIG. 1, according to some embodiments of the present disclosure.

Reference is made to FIG. 3. FIG. 3 is a schematic diagram of the amplifier circuitry 120 and the offset cancellation circuitry 140 in FIG. 1, according to some embodiments of the present disclosure. For ease of understanding, like elements in FIGS. 1-3 are designated with the same reference number.

Compared with FIG. 2, in this embodiment, the calibration circuit 144 includes a current source circuit 301 and a current source circuit 302. The current source circuit 301 and the current source circuit 302 respectively replace the transistor M5 and the transistor M6 in FIG. 2. The current source circuit 301 and the current source circuit 302 operate as a current-steering digital-to-analog converter. The current source circuit 301 is coupled to the node N1, and is configured to generate a corresponding current IA1 according to the control signal SP. In this example, both of the current IA1 and the bias current IB1 determine a current flowing through the transistor M3. For example, if the current IA1 is larger, the current steered to the transistor M3 (which may be considered as the compensation signal SP1) is larger. Alternatively, if the current IA1 is smaller, the current steered to the transistor M3 is smaller. The current source circuit 302 is coupled to the node N2, and is configured to generate a corresponding current IA2 according to the control signal SN. Similarly, both of the current IA2 and the bias current IB2 determine a current flowing through the transistor M4. For example, if the current IA2 is larger, the current steered to the transistor M4 (which may be considered as the compensation signal SP2) is larger. Alternatively, if the current IA2 is smaller, the current steered to the transistor M4 is smaller. As a result, according to the control signal SN and/or the control signal SP, the offset(s) of the amplifier circuitry 120 may be canceled.

In some related approaches, if an offset cancellation circuit is employed to calibrate offset(s) of an amplifier, circuit components of the offset cancellation circuit introduce additional capacitive loads to the amplifier, and thus the bandwidth of the amplifier is significantly decreased.

Compared with the above approaches, the offset cancellation circuitry 140 in some embodiments is able to provide the negative capacitor CEQ to improve the bandwidth of the amplifier circuitry 120. As a result, a gain-bandwidth product of the amplifier device 100 is further increased. Moreover, the offset cancellation circuitry 140 is able to adjust a current flowing through a circuit portion that generates the negative capacitor CEQ (i.e., the impedance transformation circuit 142), in order to cancel the offset of the amplifier circuitry 120. Accordingly, higher system integration is achieved.

The embodiments of each figure are given for illustrative purposes, and the present disclosure is not limited to circuit configurations, transistor types (e.g., N type or P type) and/or transistor (e.g., field transistor, bipolar junction transistors) shown in each embodiment. Various circuit configurations that are able to achieve the same operations are within the contemplated scope of the present disclosure.

Figure 4:
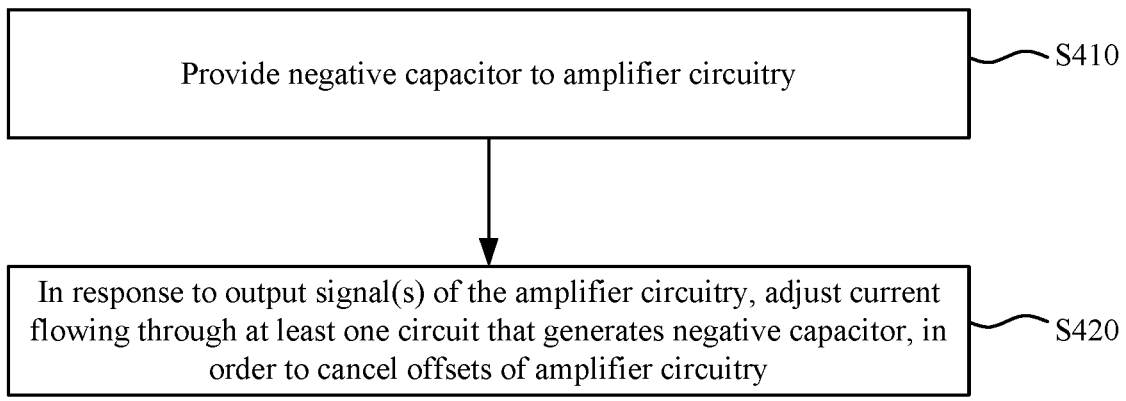
FIG. 4 is a flow chart of an offset cancellation method of some embodiments of the present disclosure.

Reference is made to FIG. 4. FIG. 4 is a flow chart of an offset cancellation method 400 of some embodiments of the present disclosure.

In operation S410, a negative capacitor is provided to an amplifier circuitry.

In operation S420, in response to output signal(s) of the amplifier circuitry, a current flowing through at least one circuit that generates the negative capacitor is adjusted, in order to cancel offsets of the amplifier circuitry.

The above operations can be understood with reference to embodiments in FIGS. 1-3, and thus the repetitious descriptions are not given. The above description of the offset cancellation method 400 includes exemplary operations, but the operations of the offset cancellation method 400 are not necessarily performed in the order described above. The order of the operations of the offset cancellation method 400 can be changed, or the operations can be executed simultaneously or partially simultaneously as appropriate, in accordance with the spirit and scope of various embodiments of the present disclosure.

As described above, the amplifier device and the offset cancellation method provided in some embodiments of the present disclosure are able to improve the bandwidth of the amplifier device with the negative capacitor, and to cancel the offsets of the amplifier device by adjusting the current flowing through a circuit that generates the negative capacitor.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An amplifier device, comprising:
   an amplifier circuitry configured to amplify a first input signal and a second input signal, in order to generate a first output signal and a second output signal;
   a controller circuitry configured to generate a first control signal and a second control signal according to the first output signal and the second output signal; and
   an offset cancellation circuitry configured to provide a negative capacitor to an output terminal of the amplifier circuitry, and to adjust at least one current flowing through a circuit, which provides the negative capacitor, of the offset cancellation circuitry according to the first control signal and the second control signal, in order to cancel an offset of the amplifier circuitry,
   wherein the offset cancellation circuitry comprises:
   an impedance transformation circuit configured to provide the negative capacitor; and
   a calibration circuit, wherein the calibration circuit and the impedance transformation circuit are coupled at a first node and a second node, and the calibration circuit is configured to adjust the at least one current flowing through the impedance transformation circuit according to the first control signal and the second control signal.

2. The amplifier device of claim 1, wherein the impedance transformation circuit comprises:
   a first transistor, wherein a first terminal of the first transistor is coupled to a first output terminal of the amplifier circuitry, and a second terminal of the first transistor is coupled to the first node;
   a second transistor, wherein a first terminal of the second transistor is coupled to a second output terminal of the amplifier circuitry and a control terminal of the first transistor, a second terminal of the second transistor is coupled to the second node, and a control terminal of the second transistor is coupled to the first terminal of the first transistor; and
   a capacitor coupled between the first node and the second node.

3. The amplifier device of claim 2, wherein the calibration circuit comprises:
   a third transistor coupled to the first node and configured to generate a first bias current according to a bias signal;
   a fourth transistor coupled to the second node and configured to generate a second bias current according to the bias signal;
   a fifth transistor coupled to the first node and configured to adjust a portion, which flows through the first transistor, of the first bias current according to the first control signal; and
   a sixth transistor coupled to the second node and configured to adjust a portion, which flows through the second transistor, of the second bias current according to the second control signal.

4. The amplifier device of claim 2, wherein the calibration circuit comprises:
   a third transistor coupled to the first node and configured to generate a first bias current according to a bias signal;
   a fourth transistor coupled to the second node and configured to generate a second bias current according to the bias signal;
   a first current source circuit coupled to the first node and configured to generate a first current according to the first control signal, in order to cooperate with the first bias current to determine a current steered to the first transistor; and
   a second current source circuit coupled to the second node and configured to generate a second current according to the second control signal, in order to cooperate with the second bias current to determine a current steered to the second transistor.

5. The amplifier device of claim 1, wherein the controller circuitry comprises:
   a first resistor configured to generate a first voltage according to the first output signal;
   a second resistor configured to generate a second voltage according to the second output signal;
   a comparator circuit configured to compare the first voltage with the second voltage, in order to generate a count signal;
   a flip flop circuit configured to output the count signal according to a clock signal; and
   a counter circuit configured to receive the count signal from the flip flop circuit according to the clock signal, and to generate the first control signal and the second control signal according to the count signal.

6. An offset cancellation method, comprising:
   providing, by an impedance transformation circuit, an negative capacitor to an output terminal of an amplifier circuitry; and generating a first control signal and a second control signal according to a first output signal and a second output signal of the amplifier circuitry; and adjusting at least one current flowing through the impedance transformation circuit in response to the first control signal and the second control signal, in order to cancel an offset of the amplifier circuitry.

7. The offset cancellation method of claim 6, wherein adjusting the at least one current flowing through the impedance transformation circuit comprises:

generating, by a first transistor, a first bias current according to a bias signal;

generating, by a second transistor, a second bias current according to the bias signal;

adjusting, by a third transistor, a portion, which flows through the impedance transformation circuit, of the first bias current according to a first control signal; and adjusting, by a fourth transistor, a portion, which flows through the impedance transformation circuit, of the second bias current according to a second control signal.

8. The offset cancellation method of claim 7, further comprising:

generating a first voltage and a second voltage according to the first output signal and the second output signal;

comparing the first voltage with the second voltage, in order to generate a count signal; and receiving the count signal according to a clock signal, and generating the first control signal and the second control signal according to the count signal.

9. The offset cancellation method of claim 6, wherein adjusting the at least one current flowing through the impedance transformation circuit comprises:

generating, by a first transistor, a first bias current according to a bias signal;

generating, by a second transistor, a second bias current according to the bias signal;

generating, by a first current source circuit, a first current according to a first control signal, in order to cooperate with the first bias current to determine a first current that flows through the impedance transformation circuit; and generating, by a second current source circuit, a second current according to a second control signal, in order to cooperate with the second bias current to determine a second current that flows through the impedance transformation circuit.

10. The offset cancellation method of claim 9, further comprising:

generating a first voltage and a second voltage according to the first output signal and the second output signal;

comparing the first voltage with the second voltage, in order to generate a count signal; and receiving the count signal according to a clock signal, and generating the first control signal and the second control signal according to the count signal.

* * * * *